United States Patent [19]

O'Neill

[11] Patent Number: 4,711,972

[45] Date of Patent: Dec. 8, 1987

[54] PHOTOVOLTAIC CELL COVER FOR USE WITH A PRIMARY OPTICAL CONCENTRATOR IN A SOLAR ENERGY COLLECTOR

[75] Inventor: Mark J. O'Neill, Richardson, Tex.

[73] Assignee: Entech, Inc., DFW Airport, Tex.

[21] Appl. No.: 892,261

[22] Filed: Aug. 4, 1986

Related U.S. Application Data

[63] Continuation-in-part of Ser. No. 752,023, Jul. 5, 1985, abandoned, which is a continuation-in-part of Ser. No. 653,148, Sep. 24, 1984, abandoned.

[51] Int. Cl.$^4$ .................................... H01L 25/02
[52] U.S. Cl. .................... 136/246; 136/256; 136/259; 350/286
[58] Field of Search .............. 136/246, 256, 259; 350/286

[56] References Cited

U.S. PATENT DOCUMENTS

| | | | |
|---|---|---|---|
| 3,714,119 | 1/1973 | Marks et al. ............... | 528/26 |
| 4,053,327 | 10/1977 | Meulenberg, Jr. ............ | 136/256 |
| 4,069,812 | 1/1978 | O'Neill ..................... | 136/246 |
| 4,301,321 | 11/1981 | Bartels ..................... | 136/246 |
| 4,307,711 | 12/1981 | Doundoulakis ............... | 126/442 |
| 4,379,202 | 4/1983 | Chalmers ................... | 136/256 |
| 4,545,366 | 10/1985 | O'Neill ..................... | 126/440 |

FOREIGN PATENT DOCUMENTS 58-48447  3/1983  Japan .................... 136/246

OTHER PUBLICATIONS

H. S. Rauschenbach, "Solar Cell Array Design Handbook", Van Nostrand Reinhold Co. (1980), pp. 252–259.

*Primary Examiner*—Aaron Weisstuch
*Attorney, Agent, or Firm*—Harold E. Meier

[57] ABSTRACT

A solar energy collector including a primary optical concentrator, one or more solar cells and an improved solar cell cover design is provided. Each of the solar cells includes a flexible cell cover which significantly reduces optical losses due to gridline obscuration of active cell area and also due to reflection from the cover itself. The cover comprises an optically clear, flexible material, such as a silicone polymer, placed over the illuminated surface of each solar cell, with prisms formed on the outer surface of the cover such that incident sunlight is refracted by the prisms onto active cell area rather than partially onto non-active gridlines or conducting elements. Each of the prisms has a predetermined shape depending on the type of primary optical concentrator used in the solar energy collector.

23 Claims, 7 Drawing Figures

PHOTOVOLTAIC CELL COVER FOR USE WITH A PRIMARY OPTICAL CONCENTRATOR IN A SOLAR ENERGY COLLECTOR

This application is a continuation-in-part of prior application Ser. No. 752,023, filed July 5, 1985 and now abandoned, which is a continuation-in-part of prior application Ser. No. 653,148, filed Sept. 24, 1984 and now abandoned.

TECHNICAL FIELD

The present invention relates to solar energy collectors and more specifically to an optical cover for improving the efficiency of solar cells used with a primary optical concentrator of such a collector.

BACKGROUND OF THE INVENTION

Photovoltaic cells, also known as solar cells, are currently being used in increasing applications for the conversion of sunlight into electricity. Such cells are generally made of silicon or other semiconductor material processed to provide a p-n junction near an illuminated surface of the cell. Under sunlight illumination, such cells generate a voltage difference between the top and bottom of the cell. To use this electrical energy, electrical current paths are provided to carry sunlight-generated current from the top of the cell through the desired electrical load and back to the bottom of the cell. The normal method of providing such current paths involves the use of conducting elements or metallic gridlines on the illuminated cell surface.

Because solar cells are currently expensive to produce, one method of improving the efficiency of photovoltaic solar energy systems is to focus incident sunlight from a large area onto smaller solar cells using a solar collector which incorporates a so-called primary optical concentrator. One such concentrator is a linear Fresnel lens, such as described in U.S. Pat. No. 4,069,812 to O'Neill. Another more efficient concentrator design is described in U.S. Pat. No. 4,545,366 to O'Neill entitled "Bi-Focussed Solar Energy Concentrator." Because operation of such devices increases the radiant energy flux on the solar cell, the electrical current produced by the cell is increased many times. To efficiently carry this higher current, more and larger gridlines or conducting elements are required for the cells used in solar collectors having primary optical concentrators than in non-focussing solar collectors.

Unfortunately, because such gridlines are formed on top of the solar cell itself, these conducting elements prevent some of the sunlight from reaching the semiconductor material which converts the sunlight into electrical energy. Therefore, present photovoltaic cell designs are generally based on a tradeoff between electrical resistance losses and gridline obscuration losses, the former being minimized by large and numerous gridlines and the latter being minimized by small and fewer gridlines. Present cell designs are therefore limited in electrical conversion efficiency due to the presence of these conducting elements. Typically, 5 to 25% of the illuminated area of the cell is covered by the opaque gridlines, causing a proportional loss in electrical conversion efficiency.

Another loss associated with the present photovoltaic solar energy conversion systems occurs because of cell encapsulation. To prevent damage to the cell by moisture, dirt, and atmospheric gases, present cells use clear dielectric coatings, such as glass, over the illuminated cell surface. Unfortunately, such clear encapsulants reflect some of the incident sunlight from their front surfaces, because the index of refraction of th dielectric material is larger than the index of refraction of the surrounding air. Typically, 3–5% of the incident light is lost due to this encapsulant front-surface reflection, again proportionally reducing the electrical conversion efficiency.

It is known in the prior art to provide covers for solar cells which refract incident sunlight away from gridlines and onto active cell areas. One such structure is shown in U.S. Pat. No. 4,053,327 to Meulenberg, Jr. The cover shown in this patent is designed for use with flat-plate, one-sun cell photovoltaic solar collectors. The Meulenberg, Jr. cell cover has not proven to be commercially viable for several reasons. In typical flat-plate applications, the cell is directly exposed to severe environmental conditions, which causes the exposed surfaces of the cover to collect dirt and therefore to function poorly. For flat-plate applications, cell covers such as shown in the Meulenberg, Jr. patent are also expensive, because every portion of the energy collection area of the solar cell must be covered. Moreover, because the covers must be molded and attached to the cells, there are also significant labor costs involved in addition to the costs for the material itself.

Yet another problem which has prevented the widespread use of such cell covers is that the energy collection area for the solar cell is normally maintained in a fixed orientation (e.g., affixed to the rooftop of a home). Because the angle between the rays of the sunlight and the energy collection area of the solar cell changes continuously throughout the day and throughout the year for fixed flat-plate collectors, cell covers such as shown in the Meulenberg, Jr. patent perform poorly for most of the time, because they require perpendicular orientation to the solar rays for proper performance.

Moreover, cell covers such as described inthe Meulenberg, Jr. patent have proven inefficient for commercialization because of the different thermal expansion/contraction characteristics of the solar cell material and the cover material. Most photovoltaic cells are made of silicon, which possesses a very low thermal expansion coefficient on the order of $3.0 \times 10^{-6}$ per degree F°. In contradistinction, the material used in making prior art cell covers is typically glass or rigid plastic, such as acrylic, which generally has a large thermal expansion coefficient on the order of $4.5 \times 10^{-5}$ per degree F°. The coefficient mismatch between the cell and the cover normally causes the cover to become severely misaligned relative to the gridlines during normal operation, which involves large variations in operating temperature. Because the expansion/contraction dimensional change of the cover is normally of the same magnitude as the normal gridline spacing and gridline width dimensions, substantial misalignment occurs. such misalignment results in severe performance degradation.

Accordingly, there is presently a need for an improved solar energy collector having a primary optical concentrator which takes full advantage of solar cell cover devices.

BRIEF SUMMARY OF THE INVENTION

According to the present invention, a unique solar cell cover geometry is provided to improve the efficiency of solar cells used in a solar energy collector having a primary optical concentrator. The described cell cover provides a more efficient photovoltaic cell conversion system by reducing optical losses associated with conducting element obscuration of solar cells used in such focussing collectors. The cell cover also substantially reduces optical losses due to front-surface reflection from the cover itself.

The cover preferably comprises a flexible optically-clear, easily moldable material covering each solar cell of the primary optical concentrator. The cover comprises a plurality of refractive prisms formed on the exposed surface of the material, such prisms configured to refract incident sunlight onto active cell area rather than partially onto non-active gridlines. Furthermore, the cover is configured such that a portion of the sunlight reflected from the cover itself is readmitted into the cover and thereafter impinges upon the active cell area.

Each of the prisms of the cell cover has a predetermined shape depending on the type of primary optical concentrator used in the solar energy collector. Preferablyl, the shape of each prism is a function of a maximum lateral incidence angle for the primary optical concentrator and best-fit values of prism "thickness" and "angular aperture" calculated by a ray-trace analysis technique. For best results, the edges of each prism are aligned with the metallic gridlines on the illuminated surface of the solar cell.

According to the present invention, the improved solar cell cover is used for solar cells in a solar energy collector having a primary optical concentrator. The primary optical concentrator is preferably a linear, bi-focussed or point-focussed Fresnel lens.

BRIEF DESCRIPTION OF THE DRAWINGS

For a more completed understanding of the present invention and the advantages thereof, reference is now made to the following Detailed Description taken in conjunction with the accompanying Drawings in which.

DETAILED DESCRIPTION

Figure 1:
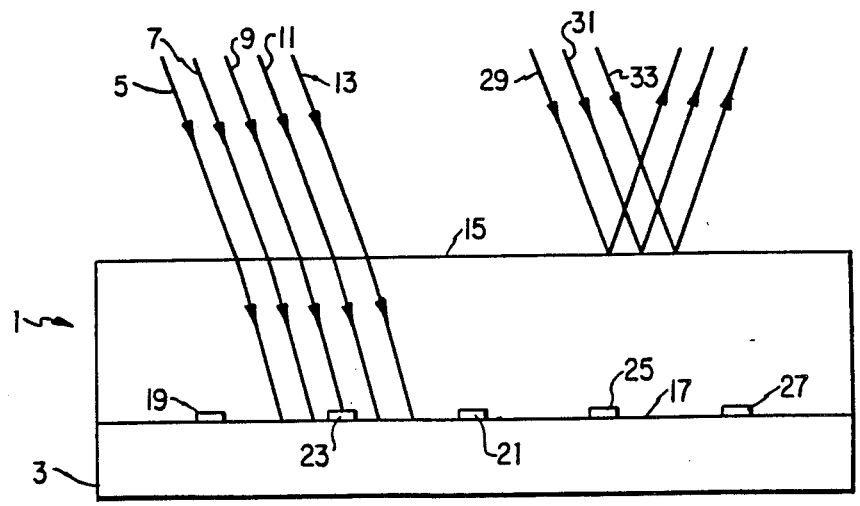
FIG. 1 is an enlarged cross-sectional drawing of a conventional photovoltaic receiver showing a typical cell encapsulation system with electrically-conducting elements or gridlines on the illuminated surface of the solar cell.

Referring now to the drawings wherein like reference characters designate like or similar elements throughout the several views, FIG. 1 shows a solar energy receiving device 1 for receiving incident solar energy and generating electrical energy. The receiving device 1 includes a photovoltaic cell 3. Light rays 5, 7, 9, 11, and 13 are shown impinging upon an optically-clear encapsulant 15 and being refracted thereby to fall upon the light activated surface, or active cell area 17, of the cell 3. The cell 3 includes conducting elements or gridlines 19, 21, 23, 25, and 27. As shown in FIG. 1, light ray 9 is refracted by the encapsulant material 15 and falls on the gridline 23. Light rays 29, 31, and 33 are also shown being partially reflected from the encapsulant material 15 and redirected away from the energy receiving device 1. As shown in FIG. 1, the energy receiving device 1 represents a prior art device in which a portion of the light rays falling on the energy receiving device 1 is refracted to the gridlines and does not fall on the active cell area 17. Other portions of the incident light rays are reflected by the encapsulant 15 and never reach the photovoltaic cell material 3.

Figure 2:
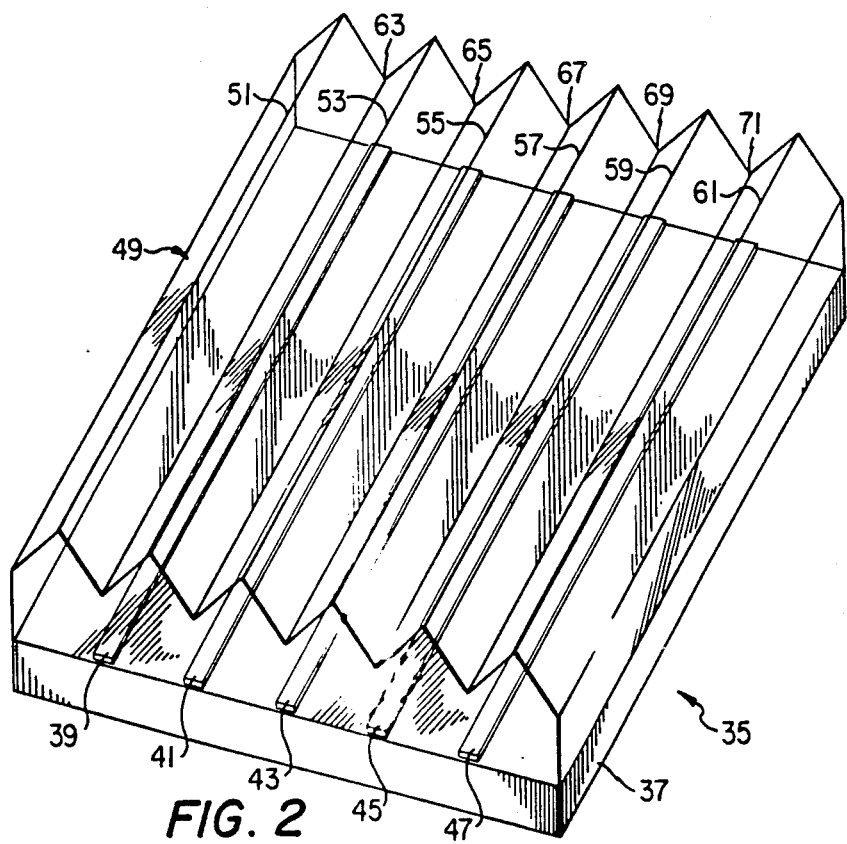
FIG. 2 is an enlarged isometric drawing of an embodiment of the solar cell cover of the present invention.

FIG. 2 shows an improved solar energy receiving device 35 comprising a photovoltaic cell 37 having gridlines or conducting elements 39, 41, 43, 45, and 47 mounted on the surface of the cell 37. An optically clear prismatic cell cover 49 is placed over the cell surface area including the gridlines 39-47. The upper surface of the cell cover 49 includes a plurality of prisms arranged in juxtaposition such that the peaks 51-61 of the prisms are directly over active areas of the cell 37 and the valleys 63-71 are positioned directly above the gridlines 39-47, respectively, and co-extend therewith. The bottom surface of the cell cover 49 may be bonded to the solar cell 37 and the gridlines mounted thereon.

Figure 3:
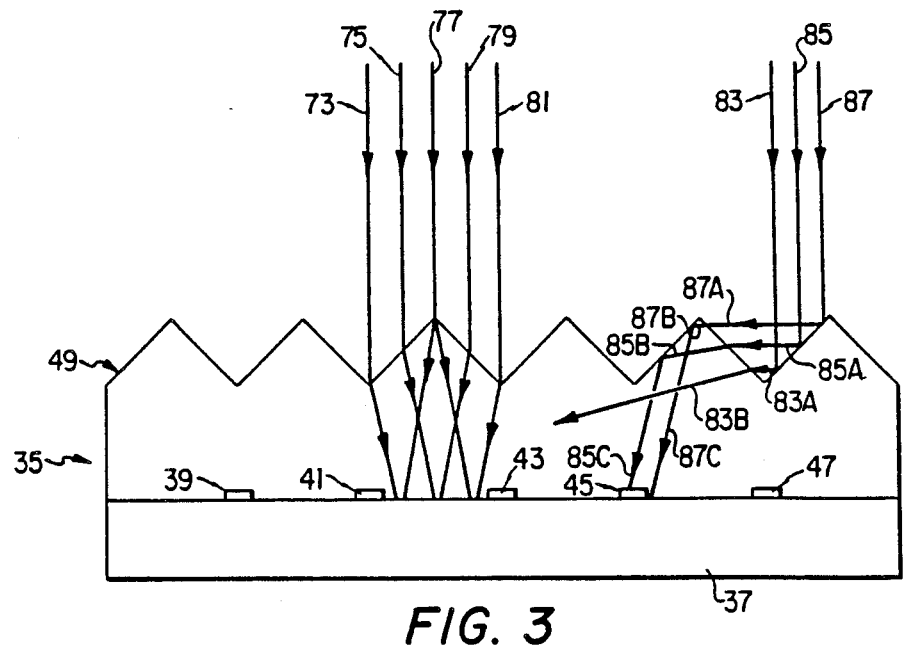
FIG. 3 is an enlarged cross-sectional drawing of the embodiment shown in FIG. 2.

FIG. 3 shows the solar energy receiving device 35 of FIG. 2 with light rays 73, 75, 77, 79, and 81 being directed toward the prismatic upper surface of the cell cover 49 and being refracted thereby to fall upon the active surface area of the photovoltaic cell material 37. As also shown, light rays 83, 85, and 87 fall upon the prismatic cell cover 49 and, although portions of this radiation are reflected by the cover 49, rays 85A and 87A are reflected to a neighboring prism which, in turn, refracts and reflects such rays back toward the photovoltaic cell 37.

Figure 4:
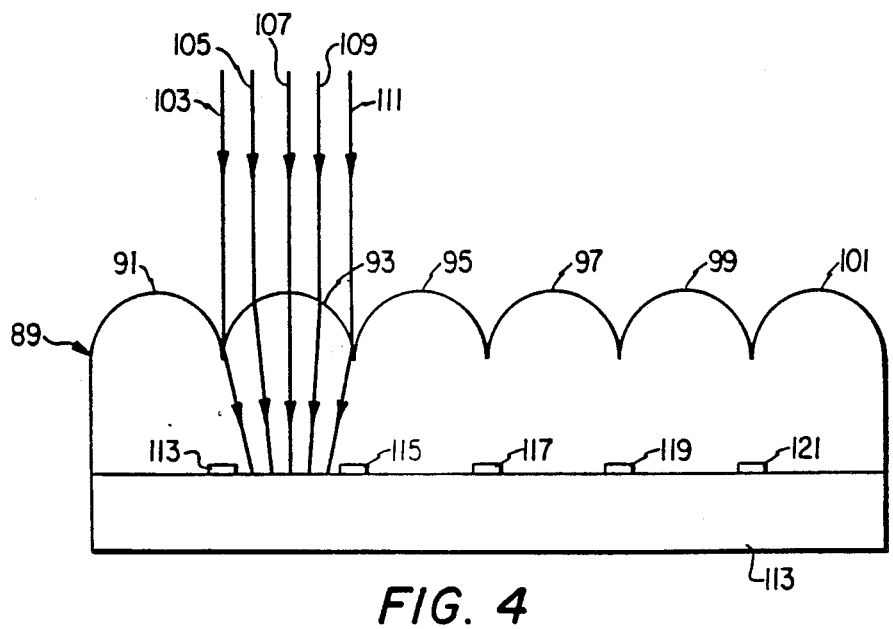
FIG. 4 is an enlarged cross-sectional drawing of another embodiment of the solar cell cover.

FIG. 4 shows another embodiment which includes a cell cover 89 having cylindrical prisms 91, 93, 95, 97, 99, and 101, rather that the rectilinear prisms shown in FIGS. 2 and 3. Light rays 103, 105, 107, 109, and 111 are shown falling upon the cylindrical prism 93 and refracted thereby onto active cell area of the photovoltaic cell 113. As can be seen from FIG. 4, the valleys of the cylindrical prisms are arranged to be directly above and co-extend with corresponding gridlines 113-121.

Referring back to FIG. 1, the operation of the solar cell cover will now be described. The normal method of making solar photovoltaic cell systems for converting sunlight to electricity involves the use of semiconductor materials (e.g., silicon) which are processed to form a p-n junction between the front and back surfaces of the cell. Under sunlight illumination, the photovoltaic cell 3 produces a usable potential difference between the front and back surfaces of the cell which, in turn, produces an electrical current when connected in a circuit across an electrical load. To collect this usable current efficiently, the electrically-conducting gridlines 19-27 are deposited onto the illuminated front surface of the solar cell 3. These gridlines are generally made of metal, such as silver or copper, and are therefore opaque to sunlight. To protect the gridlines 19-27 and the semiconductor cell 3 from environmental degradation, such as oxidation or corrosion, optically clear dielectric material 15, such as glass, is used to encapsulate the front surface of the solar cell. Light rays 5-13 from the sun are transmitted into the encapsulant 15. Unfortunately, a portion of the transmitted rays intercept the metallic gridlines as shown with respect to gridline 23 in FIG. 1, rather than the active cell area 17 between the gridlines. Rays that intercept the opaque gridlines are absorbed and/or reflected by the gridlines and are not converted into electrical energy. This gridline obscuration of active cell area generally causes a 5-25% loss of efficiency, depending on the fraction of the cell area which is obscured by the gridlines.

Another significant optical loss associated with the conventional solar photovoltaic cell system of FIG. 1 is reflection from the encapsulant. Some of the incident solar rays 29-33 are reflected from the front surface of the encapsulant 15. This reflection occurs because the index of refraction of the encapsulant is higher that the index of the refraction of the surrounding air. Typically, 3-5% of the incident sunlight is lost due to reflection.

The solar cell covers shown in FIGS. 2-4 minimize the optical losses discussed above. Referring to FIG. 2, the dielectric prismatic cell cover 49 is bonded, in this example, to the solar cell 37. The incident solar rays 73-81, shown in FIG. 3, are refracted by the prisms of cover 49 such that transmitted solar rays fall between metallic gridlines 39-47 onto the active cell area of the cell 37. Because essentially all of the transmitted rays fall on active cell areas, high electrical conversion efficiency is obtained. Therefore, the prismatic cell cover 49 substantially eliminates gridline obscuration losses and improves performance significantly. The cell cover also minimizes reflection losses from the dielectric cover itself. Again referring to FIG. 3, incident solar rays 83-87 are partially reflected by the prismatic cell cover 49, forming reflected rays 83A-87A. Rather than being lost, however, those rays enter the adjacent prism as transmitted rays 83B-87B. Some of those transmitted rays 83B proceed directly to the solar cell 37, while other transmitted rays 85B-87B are totally internally reflected at the inside prism surface, becoming rays 85C-87C which proceed onto the solar cell 37. Therefore, essentially all of the reflected rays 83-87 eventually reach the solar cell 37, increasing the electrical conversion efficiency of the system significantly as compared to the conventional solar cell system of FIG. 1.

For optimum efficiency, the prismatic cell cover 49, consisting of a plurality of prisms, is placed over and parallel to the metallic gridlines 39-47, such that the valleys 63-71 of the prisms are directly over the gridlines 39-47 while the peaks 51-61 of the prisms are directly over the active cell area between the gridlines 39-47.

In the preferred embodiment, the cell cover is formed of a flexible, optically clear, easily moldable, durable material such as a silicone polymer (which is available from General Electric Company under the trade designation RTV-615) and integrally-bonded to the solar cell. This material is advantageous because during large variations in operating temperature, the flexible cover merely compresses or expands to the same degree as the silicon material of the solar cell. Accordingly, misalignment between gridlines and prisms (of the cell cover) does not occur as in prior art cell covers formed of glass or acrylic.

In the preferred embodiment of the invention, the cell covers are used with solar cells forming the energy receiver of a solar energy collector having a primary optical concentrator. One such concentrator design is a "line-focussing" approach described in U.S. Pat. No. 4,069,812. Another design is a "bi-focussed" approach which is described in U.S. Pat. No. 4,545,366 entitled "Bi-Focussed Solar Energy Concentrator." The invention is also applicable to other primary optical concentrators of the point-focussed type as well as line-focussing concentrators which track the sun in only one direction.

Figure 5:
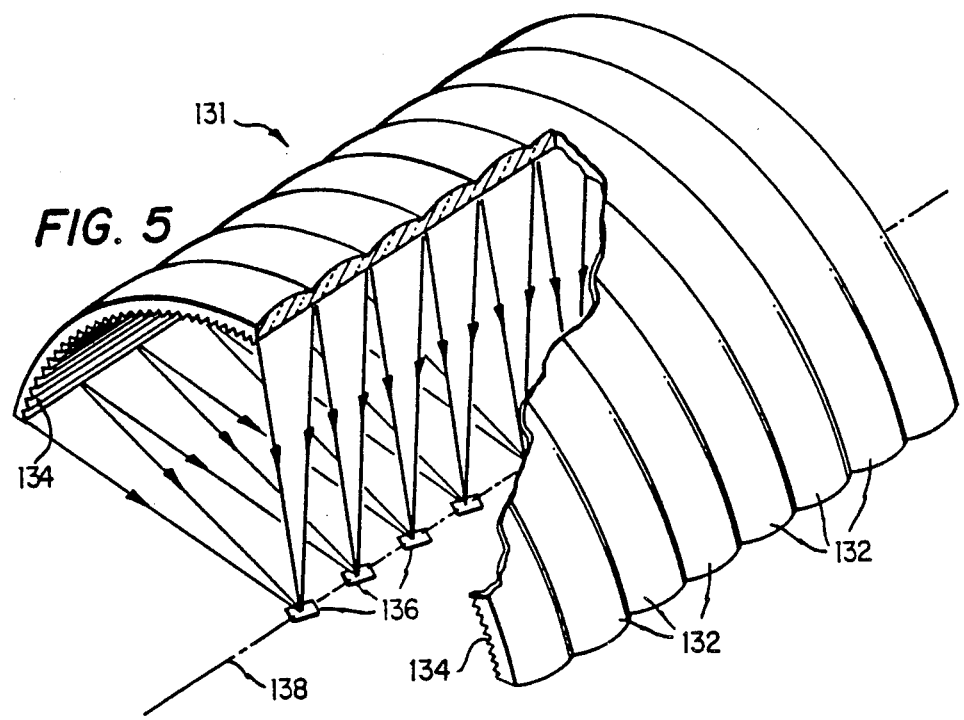
FIG. 5 is a perspective cutaway view of a solar energy collector having a bi-focussed primary optical concentrator and a plurality of solar cells located along a longitudinal axis thereof.

Referring now to FIG. 5, a solar energy collector having a primary optical concentrator 131 is provided, as in U.S. Pat. No. 4,545,366. The concentrator 131 has a series of cylindrical lens elements 132 mounted adjacent to each other along the length thereof. The inner surface of the concentrator 131 is comprised of a plurality of linear prisms 134 mounted adjacent to each other in a direction perpendicular to the axes of the cylindrical lenses 132 and running parallel to a longitudinal axis 138 (i.e., a focal zone) of the solar energy collector. Without the cylindrical lens elements 132, incident sunlight would be refracted by the prisms 134 and focussed along the longitudinal axis 138, as more particularly described in U.S. Pat. No. 4,069,812. While this "line-focussing" operation is very efficient, it requires a continuous photovoltaic surface (i.e., a plurality of abutting solar cells) along the longitudinal axis 138 in order to maximize the energy output from the collector. That process is therefore somewhat expensive because of the relatively high costs of the silicon solar cells used in converting radiant energy into electrical energy. However, through the implementation of the cylindrical lens elements 132 cross-coupled to the linear prisms 134, the energy incident upon the top of the concentrator 131 is focussed in two directions. In particular, the cylindrical lens elements 132 converge light toward discrete solar cell elements 136 of the collector while the linear prisms 134 further focus the converging radiant energy along the longitudinal axis 138, thereby enabling the use of discrete solar cells 136 instead of a continuous row of solar cells as shown in U.S. Pat. No. 4,069,812.

Figure 6:
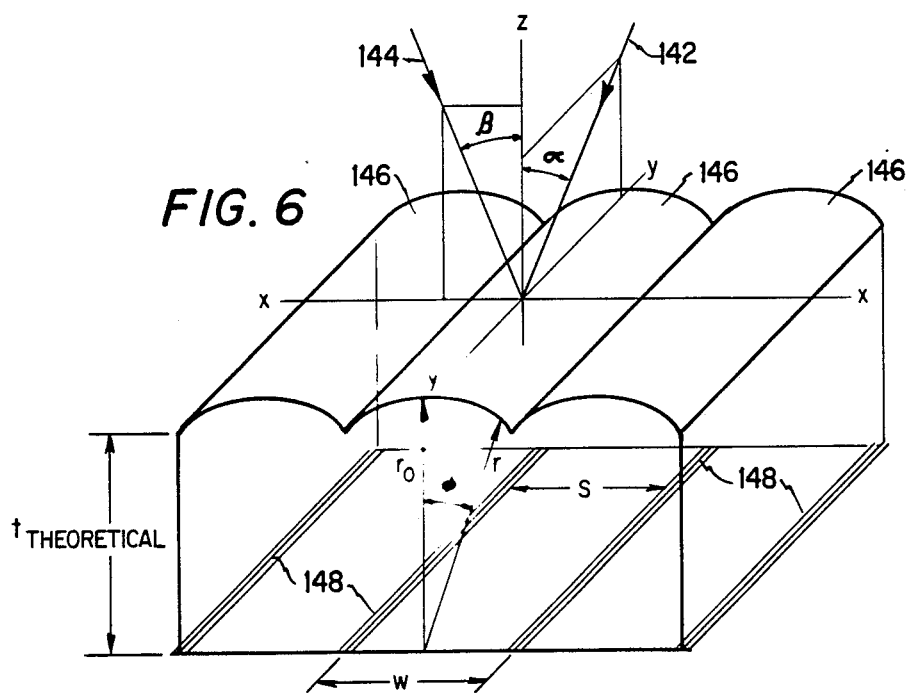
FIG. 6 is a perspective view of a preferred solar cell cover of the present invention.

According to the present invention, each of the solar cells 136 used with the primary optical concentrator 131 in the collector of FIG. 5 includes a cell cover having a unique geometry. With reference now to FIG. 6, a perspective view is shown of a preferred cell cover geometry of the present invention. When cell covers of the types shown in FIGS. 2-4 are used with a primary optical concentrator of the type shown in FIG. 5, rays of light impinge on each cell cover from a variety of directions depending on the position of the solar cell in the focal zone of the concentrator as well as the type of concentrator used. As seen in FIG. 6, this operation is evidenced by a focussed ray 142, which makes a lateral incidence angle "alpha" ($\alpha$) with respect to the y-z plane, and by the focussed light ray 14, which makes a longitudinal incidence angle "beta" ($\beta$) with respect to the x-z plane. For the bi-focussed primary optical concentrator of FIG. 5, the lateral incidence angle varies from approximately $-45°$ to $+45°$ (with alpha$=0°$ for rays coming from the center of the lens), while the longitudinal incidence angle varies from approximately $-4°$ to $+4°$. By comparison, the linear Fresnel lens of U.S. Pat. No. 4,069,812 has approximately the same variation in lateral incidence angle, however, the maximum longitudinal incidence angle is typically 0°. In a typical point-focussed primary optical concentrator, however, the lateral and longitudinal incidence angles are normally equal and vary between $-30°$ to $+30°$.

Finally, where the primary optical concentrator is of the line-focussed type and tracking is carried out in one direction, alpha varies between approximately −30° to +30° while beta varies between approximately −23° to +23°, depending on the time of year.

According to the present invention, each of the prisms 146 of the cell cover of FIG. 6 is designed to have an identical but unique shape so as to achieve the best overall focussing for all of the rays coming from all parts (i.e., rays having non-zero alpha and beta angles) of the primary optical concentrator used in the collector. The following four equations, in conjunction with a ray trace analysis of various options, determines the optimal prism cover design.

Effective Index of Refraction:

$$n' = 0.5*sqrt((n*n - \sin(alpha)*\sin(alpha))/(1 - \sin(alpha)*\sin(alpha))) + 0.5*n \quad (1)$$

where
"alpha" is the maximum lateral incidence angle for the primary optical concentrator, and
"n" is the index of refraction of the cover material.
Theoretical Focal Length of Prism:

$$r_0 = w/2/\sin(phimax)/(n'-1)*(n' - \cos(phimax)) \quad (2)$$

where
"w" is the centerline spacing between adjacent gridlines 148, and
"phimax" is an angular aperture of the prism.
Theoretical Base Thickness of Prism:

$$t_{theoretical} = w/2/\tan(phimax) \quad (3)$$

Prism Shape for $-phimax \leq phi \leq phimax$:

$$r = r_0*(n'-1)/(n' - \cos(phi)) \quad (4)$$

Figure 7:
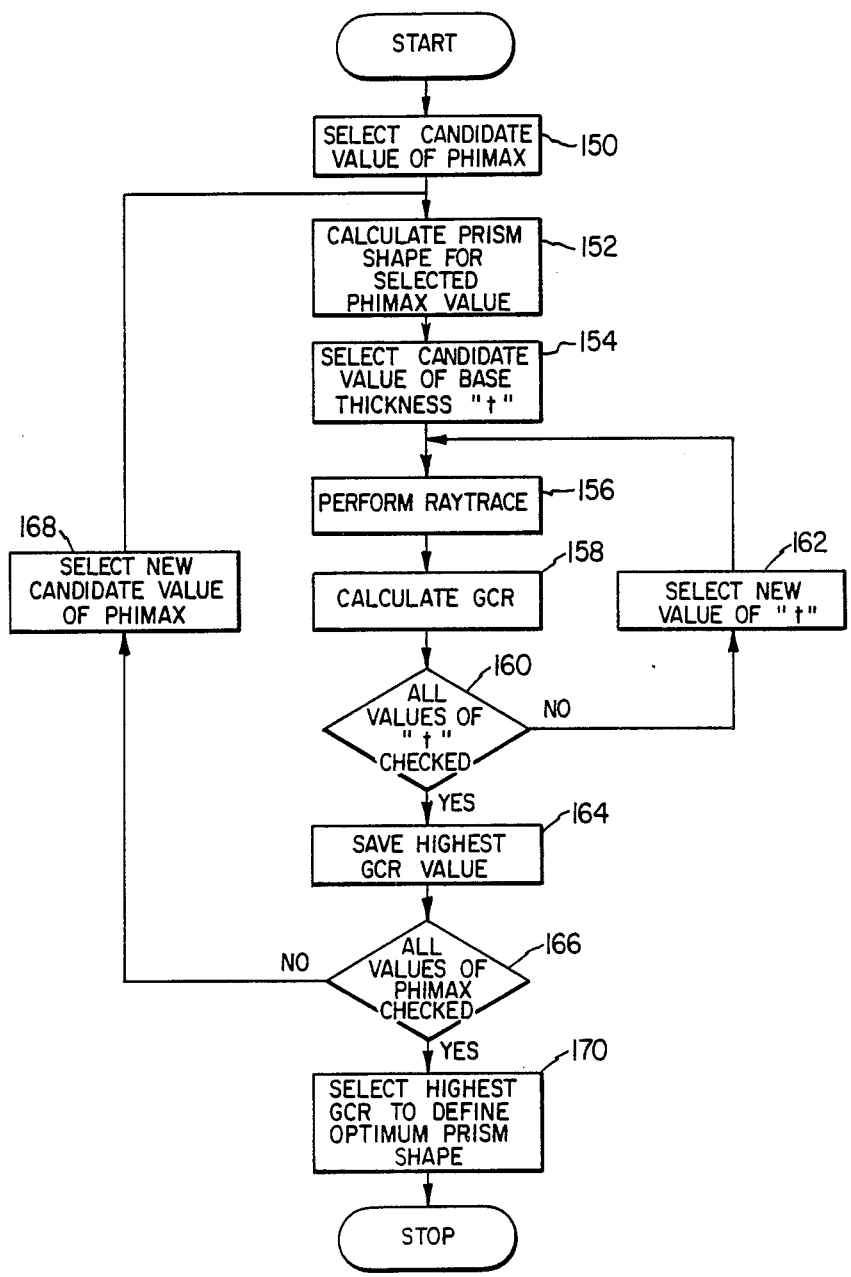
FIG. 7 is a flowchart diagram of a preferred method for determining an optimum prism geometry for the solar cell cover of FIG. 6.

Referring now to FIG. 7, a flowchart diagram is shown of a preferred method according to the invention for determining the optimum prism geometry for each prism 146 of the solar cell cover of FIG. 6. The method begins at step 150 by selecting a candidate value of prism angular aperture ("phimax"). At step 152, a prism shape is calculated (for the selected candidate value of phimax) using equations (1)-(4) above. Specifically, knowing "n" as a material property, "alpha" as the maximum lateral angle of incidence for the primary optical concentrator, "beta" as the maximum longitudinal angle of incidence for the concentrator, and "w" as the centerline spacing of adjacent gridlines 148 as seen in FIG. 6, the effective index of refraction "n'" is calculated from equation (1). Equations (2) and (3) are then used to define the theoretical focal length "r₀" and theoretical base thickness "$t_{theoretical}$" of the prism for the selected candidate value of phimax. Likewise, equation (4) is used at step 152 to define the shape of the top of the prism in conventional polar coordinate format.

Once the overall prism shape is generated for the selected phimax value, the method continues at step 154 by setting the base thickness "t" (for the prism corresponding to the selected candidate phimax value) equal to a candidate value of base thickness, e.g., the theoretical base thickness "$t_{theoretical}$." At step 156, numerous rays are traced (via a ray trace analysis scheme) from all parts of the primary concentrator, with incidence angles up to and including the alpha and beta values. These rays are traced through the prism (after refraction) and onto the cell. The width of an image formed by all rays traced in this fashion is defined as "s" in FIG. 6. The method continues at step 158, wherein a "geometrical concentration ratio" (GCR), defined as "w/s," is generated for the candidate value of phimax. At step 160, a test is made to determine if all desired values of base thickness "t" have been evaluated. If not, the method selects a new value of "t" at step 162 and then returns to step 156. A new GCR is then generated (at step 158) corresponding to the new value of base thickness (selected at step 162). This new GCR value, however, is still a function of the candidate value of phimax.

If the result of the test at step 160 is positive, the method continues at step 164 by saving the highest GCR calculated for the candidate phimax value. At step 166, another test is made to determine if all desired values of phimax have been evaluated. If not, the method selects a new candidate value of phimax at step 168 and then returns to step 152. Steps 152-166 are then repeated for the new candidate phimax value(s). If the result of the test at step 166 is positive, the method continues at step 170 to select the highest GCR saved from the plurality of iterations of step 164. This GCR value represents the combination of base thickness "t" and angular aperture "phimax" which provides the maximum overall amount of gridline obscuration elimination for the selected type of primary optical concentrator.

The design procedure set forth in FIG. 7 produces a prism shape which is significantly different from the prism shape in prior art cell covers which are maintained perpendicular to the sunlight in flat-plate applications. In particular, equation (1) defines an effective index of refraction "n'" which is higher in value than the actual index of refraction "n." This higher alue corresponds to the fact that the designed prism geometry provides stronger refractive power for rays which make non-zero alpha values than for rays with zero alpha values. If alpha equals zero in equation (1), the effective index "n'" is equal to the actual index "n." Equation (2) defines the theoretical focal length of the prism for an aspheric lens prism with aperture width equal to "w" and angular aperture equal to "phimax." Equation (3) defines the theoretical base thickness of the prism for the same values of "w" and phimax. Equation (4) defines the shape of the aspheric (corrected for spherical aberration) lens prism between its limits of angular aperture.

It has been determined from the ray trace analysis described above that for the special case of beta equal to zero, the optimum base thickness "t" is very close to the theorectical base thickness "$t_{theoretical}$." However, for non-zero beta values, the optimum base thickness is generally less than the theoretical base thickness due to image distortions caused by the longitudinal incidence angle beta.

In summary, the preeferred design approach calculates an effective index of refraction, theoretical prism focal length, theoretical base thickness and prism shape for each candidate value of phimax using equations (1)-(4). A parametric ray trace analysis is then used to generate a maximum GCR for varying values of base thickness. This process is repeated for several candidate values of phimax to generte the prism geometry which provides the highest amount of cell metallization of, alternatively, for the highest tolerance for manufacturing errors (thickness and alignment). This design approach, although preferred, is not meant to be limiting.

For example, the method may calculate vaues of GCR at step 158 for varying values of phimax (rather than "t"), in which case the iteration at steps 166–168 would select varying values of base thickness (instead of phimax).

The following computer program listing may be used to carry out the method of FIG. 7:

| Copyright 1986, Entech, Inc. | |
|---|---|
| 0 | rem this program calculates lens prism performance |
| 10 | def fn as(k)=atn(k/sqr(1−k*k)) |
| 20 | pi = 4*atn(1) |
| 25 | input"case title";ct$ |
| 30 | input"lens rim angle in deg";rd:ra=rd/180*pi |
| 32 | input"prism width in mils";w |
| 34 | input"long inc angle in deg";ld |
| 40 | input"prism rim angle in degrees";pd |
| 50 | for dy=−10to10 step 2 |
| 60 | pm=pd*pi/180 |
| 65 | li=ld*pi/180 |
| 70 | n1=1 |
| 80 | n2=1.41 |
| 90 | z1=fn as(sin(ra)/n2):z2=cos(z1)/cos(ra)*n2:nd=(n2+z2)/2 |
| 100 | rm=w/2/sin(pm) |
| 110 | r0=rm*(n1/nd*cos(pm)−1)/(n1/nd−1) |
| 140 | for a1=0 to (ra+.001) step ra |
| 145 | for z3=0 to (li+.001) step li |
| 150 | i1(1)=−sin(z3):i1(2)=−cos(z3)*cos(a1):i1(3)=−cos(z3)*sin(a1) |
| 160 | for p = −pm to 1.01*pm step .2*pm |
| 170 | t=−atn(sin(p)/(n1/nd−cos(p))) |
| 180 | n(1)=sin(t):n(2)=cos(t):n(3)=0 |
| 190 | idn=i1(1)*n(1)+i1(2)*n(2)+i1(3)*n(3) |
| 195 | if idn>=0 then 380 |
| 200 | t1=−n1/n2*idn−sqr(1−n1*n1/n2/n2+n1*n1/n2/n2*idn*idn) |
| 210 | t2=−n1/n2 |
| 220 | for q=1to3:i2(q)=t1*n(q)+t2*i1(q):nextq |
| 230 | r=r0*(n1/nd−1)/(n1/nd*cos(p)−1) |
| 240 | x=r*sin(p) |
| 250 | y=r*cos(p) |
| 260 | xi=x−(y+dy)*i2(1)/i2(2) |
| 270 | if abs(xi)>=xm then xm = abs(xi) |
| 280 | ta=fn as(sqr(1−idn*idn)) |
| 290 | tp=fn as (n1/n2*sin(ta)) |
| 300 | r1=sin(ta−tp)/sin(ta+tp) |
| 310 | r2=tan(ta−tp)/tan(ta+tp) |
| 320 | rho=.5*(r1*r1+r2*r2) |
| 330 | tr=1−rho |
| 340 | print"alpha="a1*180/pi:print"long inc="z3*180/pi |
| 350 | print"x="x |
| 360 | print"x−int="xi |
| 370 | print"tau="tr |
| 375 | tt=tt+tr:kc=kc+1 |
| 380 | next p |
| 390 | print"gcr="w/2/xm |
| 400 | nextz3: nexta1 |
| 410 | Print"tau−avg="tt/kc |
| 500 | open1,4,7:cmd1 |
| 502 | if z4=0 then printct$:print" " |
| 505 | if z4=0 then print"lens rim angle="rd"degrees "; |
| 506 | if z4=0 then print"prism rim angle="pd"degrees" |
| 510 | if z4=0 then print"prism width="w"mils"; |
| 530 | if z4=0 then print"refractive index="n2 |
| 550 | if z4=0 then print"longitudinal incidence angle="ld"degrees" |
| 555 | if z4=0 then print"average prism transmittance="int(tt/kc*10000+.5)/10000 |
| 557 | if z4=0 then print " ":print"" |
| 560 | print"prism true thickness−theoretical thickness="dy"mils "; |
| 570 | print"*** geometric concentration ratio="int (w/2/xm*1000+.5)/1000; |
| 572 | print#1:close1 |
| 574 | kc=0:xm=0:tt=0:z4=z4+1:nextdy |
| 575 | z4=0:gosub577:end |
| 577 | input"design thickness error in mils";dy |
| 578 | open1,4,7:cmd1 |
| 580 | print" ":print"prism shape data" |
| 600 | rem prism shape |

| -continued | |
|---|---|
| Copyright 1986, Entech, Inc. | |
| 610 | for p=−pmtopm step pm/10 |
| 700 | r=r0*(n1/nd−1)/(n1/nd*cos(p)−1) |
| 710 | x=r*sin(p) |
| 720 | y=r*cos(p):yp=y+dy |
| 725 | x=int(x*1000+.5)/1000:y=int(y*1000+.5)/1000:yp=int(yp*1000+.5)/1000 |
| 730 | print"x="x"mils y="y"mils yp="yp"mils" |
| 740 | nextp:printchr$(12) |
| 750 | print#1:close1 |
| 800 | return |

The above program can be executed on any suitable computer hardware system having appropriate input-/output devices. Such systems are well within the knowledge of the prior art and form no part of this invention.

The cell covers produced according to the present invention are preferably made from a flexible, optically-clear, easily moldable, durable material such as a silicone polymer. The use of this type of cell cover for solar cells with a primary optical concentrator of a solar collector is extremely advantageous. Because the solar cells are enclosed within the primary optical concentrator of the collector itself, they are less likely to be affected by environmental factors, a primary problem in prior flat-plate applications.

Although the invention has been described in detail, it is to be clearly understood that the same is by way of illustration and example only and is not to be taken by way of limitation, the spirit and scope of the invention being limited only to the terms of the appended claims.

I claim:

1. A radiant energy converter for converting radiant energy into electrical energy, the converter having a focal zone, comprising:

(a) primary optical concentrator including focusing means having a preselected configuration and receiving incident radiant energy for focusing the energy onto the focal zone;

(b) one or more photovoltaic cells individually located in the area of the focal zone, each of the cells having active material and a pattern of electrically-conducting elements positioned on and obscuring a portion of the active material, the active material for receiving the radiant energy and in response thereto generating an electrical signal; and (c) a cell cover for each of the cells, said cell cover having one or more refractive elements, each having a geometry selected to be compatible with the preselected configuration of the focusing means of the primary optical concentrator and further determined by the pattern of electrically conducting elements positioned on the active areas of the cells, said cell cover receiving the focused radiant energy from over a wide angular distribution from the primary optical concentrator depending on the location of the cell in the focal zone and the preselected configuration of the focusing means of the primary optical concentrator and in response thereto refracting the radiant energy away from the pattern of electrically conducting elements and onto the active area of the cells not obscured by the conducting elements.

2. The radiant energy converter as described in claim 1 wherein the shape of each refractive element is a function of a predetermined lateral incidence angle produced by the primary optical concentrator.

3. The radiant energy converter as described in claim 1 wherein the shape of each refractive element is a function of a predetermined base thickness and the angular aperture of the refractive element.

4. The radiant energy converter as described in claim 1 wherein the refractive elements have a predetermined width equal to the spacing between a pair of parallel straightline electrically-conducting elements.

5. The radiant energy converter as described in claim 1 wherein the primary optical concentrator includes a line-focus Fresnel lens.

6. The radiant energy converter as described in claim 1 wherein the primary optical concentrator includes a bi-focussed Fresnel lens.

7. The radiant energy converter as described in claim 1 wherein the primary optical concentrator includes a point-focus Fresnel lens.

8. A radiant energy converter for converting radiant energy into electrical energy wherein the converter has a focal zone, comprising:
- a primary optical concentrator, including means receiving incident radiant energy for focusing the energy onto the focal zone of said converter;
- one or more photovoltaic cells located in the focal zone, each of the cells having active material and a pattern of electrically-conducting elements positioned on the active material and obscuring a portion thereof, the active material for receiving the radiant energy and in response thereto, generating an electrical signal; and
- a secondary optical concentrator positioned in the path of radiant energy from said primary optical concentrator to one or more of said photovoltaic cells, said secondary optical concentrator having refractive elements for receiving and focusing from a wide-angular field of view, said field of view including substantially all of the focusing surface of said primary optical concentrator, the radiant energy onto the regions of active material of said photovoltaic cells and away from the pattern of electrically-conducting elements positioned on the active material.

9. The radiant energy converter as described in claim 8 wherein each of the refractive elements has an effective index of refraction which is a function of a predetermined lateral incidence angle produced by the primary optical concentrator.

10. The radiant energy converter as described in claim 8 wherein the primary optical concentrator is a line-focus Fresnel lens.

11. The radiant energy converter as described in claim 8 wherein the primary optical concentrator is a bi-focus Fresnel lens.

12. The radiant energy converter as described in claim 8 wherein the primary optical concentrator is a point-focus Fresnel lens.

13. A flexible photovoltaic cell cover for use in a radiant energy converter having a primary optical concentrator and one or more photovoltaic cells located in a focal zone, comprising:
- a plurality of prisms for receiving solar rays of light from all parts of the primary optical concentrator, each of the prisms having a predetermined shape defined by the following equations:

$$n' = 0.5 * sqr((n*n - \sin(alpha)*\sin(alpha))/(1 - \sin(alpha)*\sin(alpha))) + 0.5*n \quad (1)$$

where
"alpha" is a maximum lateral incidence angle for the primary optical concentrator, and
"n" is an index of refraction of the cell cover material $$r_0 w/2/\sin(phimax)/(n'-1)*(n'-\cos(phimax))$$

where
"w" is the centerline spacing between adjacent gridlines, and
"phimax" is an angular aperture of the prism $$t_{theoretical} = w/2/\tan(phimax) \quad (3)$$

$$r = r_0 * (n'-1)/(n'-\cos(phi)) \quad (4).$$

14. A photovoltaic cell cover for use in a radiant energy converter including a primary optical concentrator having focusing means of a preselected configuration, and at least one photovoltaic cell having a plurality of gridlines, the cell cover including one or more refractive elements each having a geometry defined by a process comprising the steps of:
- (a) selecting a value of a first predetermined characteristic for the refractive element;
- (b) calculating a shpae of the refractive element as a function of the selected refractive element value of the first predetermined characteristic;
- (c) selecting a value of a second predetermined characteristic for the refractive element;
- (d) tracing rays of light through the calculated refractive element shape from substantially all angles of the primary optical concentrator as determined by the geometry of the preselected configuration to determine a width of an image formed by the calculated refractive element shape;
- (e) calculating a geometric concentration ratio for the calculated refractive element shape as a function of the image width and a centerline spacing between adjacent gridlines of the cell;
- (f) repeating steps (d)-(e) for a plurality of values of the second predetermined characteristic; and
- (g) repeating steps (b)-(f) for a plurality of values of the first predetermined characteristic; and
- (h) selecting a predetermined value of the geometric concentration ratio to define an optimum refractive element shape for the cell cover used with the selected primary optical concentrator.

15. The cell cover as described in claim 14 wherein the first predetermined characteristic for the refractive element is angular aperture.

16. The cell cover as described in claim 15 wherein the second predetermined characteristic for the refractive element is base thickness.

17. The cell cover as described in claim 14 wherein the predetermined alue of the geometric concentration ratio is the maximum value calculated in step (e).

18. A radiant energy converter, comprising:
- a primary optical concentrator for focusing incident radiant energy rays into a convergent bundle onto a focal zone of the converter;
- one or more photovoltaic cells located at the focal zone, each of the cells having an active material area and a pattern of electrically conducting elements positioned on the active area and obscuring a portion thereof, the active area for receiving the radiant energy rays and, in response thereto, generating an electrical signal; and a secondary optical concentrator positioned to receive radiant energy rays from said primary optical concentrator and for focusing the radiant energy rays onto the active material areas of said photovoltaic cells, the secondary optical concentrator including means for receiving the convergent bundle of radiant energy rays focused by the primary optical concentrator and to refract such rays to impinge substantially only on the active material area of the photovoltaic cells not obscured by conducting elements.

19. The radiant energy converter as set forth in claim 18 wherein said means for receiving includes a refractive element having a cross-sectional shape corresponding to a conic section with three independent geometrical variables including eccentricity, angular aperture, and the spacing between said element and the one or more photovoltaic cells.

20. The radiant energy converter as set forth in claim 18 wherein said means for receiving includes a refractive element having a cross-sectional shape corresponding to a half circle with two independent geometrical variable including radius of curvature and the spacing between said refractive element and the one or more photovoltaic cells.

21. The radiant energy converter as set forth in claim 18 wherein said means for receiving includes a refractive element having a cross-sectional shape corresponding to an isosceles triangle with two independent geometrical variable including the apex angle of the isosceles triangle and the spacing between the refractive element and said one or more photovoltaic cells.

22. A cover for a photovoltaic cell for use with a primary optical concentrator having a defined geometric configuration in a radiant energy converter, the converter having one or more photovoltaic cells located in a focal zone, comprising:

refractive means having a geometric configuration defined by the geometric configuration of the primary optical concentrator and adapted to receive radiant energy focused by the primary optical concentrator from an extended angular field of view for further focusing the radiant energy into alternating regions of high and low intensity, wherein the regions of high intensity are coincident with active photovoltaic material of the photovoltaic cell and those regions of low intensity are coincident with non-active areas of photovoltaic cell.

23. The photovoltaic cell cover as set forth in claim 22 wherein the refractive means include means for accepting non-collimated radiant energy rays initially focused by the primary optical concentrator for refracting such rays to the active material areas of the photovoltaic cells.

* * * * *

UNITED STATES PATENT AND TRADEMARK OFFICE
CERTIFICATE OF CORRECTION

PATENT NO. : 4,711,972
DATED : December 8, 1987
INVENTOR(S) : Mark J. O'Neill

It is certified that error appears in the above-identified patent and that said Letters Patent is hereby corrected as shown below:

```
Column 2, line 4, change "th" to --the--.
Column 2, line 39, change "inthe" to --in the--.
Column 2, line 57, change "such" to --Such--.
Column 3, lines 20-21, change "Preferablyl" to --Preferably--.
Column 6, line 55, change "14" to --144--.
Column 7, line 25, after "r_o" insert -- = --.
Column 8, line 35, change "alue" to --value--.
Column 8, line 52, change "theorectical" to --theoretical--.
Column 8, line 57, change "preeferred" to --preferred--.
Column 8, line 64, change "generte" to --generate--.
Column 8, line 65, change second occurrence "of" to --or--.
Column 12, line 9, after "r_o" insert -- = --.
Column 12, line 26, change "shpae" to --shape--.
Column 12, line 42, delete "and".
Column 12, line 56, change "alue" to --value--.
```

Signed and Sealed this

Twenty-fourth Day of May, 1988

Attest:

DONALD J. QUIGG

*Attesting Officer*  *Commissioner of Patents and Trademarks*